United States Patent [19]

Caravella et al.

[11] Patent Number: 5,510,739
[45] Date of Patent: Apr. 23, 1996

[54] CIRCUIT AND METHOD FOR ENHANCING LOGIC TRANSITIONS APPEARING ON A LINE

[75] Inventors: James S. Caravella; Ben Gilsdorf, both of Phoenix, Ariz.

[73] Assignee: Motorola, Inc., Schaumburg, Ill.

[21] Appl. No.: 218,283

[22] Filed: Mar. 28, 1994

[51] Int. Cl.[6] .................................................. H03K 17/12
[52] U.S. Cl. ............................. 327/112; 327/74; 327/76; 327/81; 327/387; 327/108
[58] Field of Search ................................ 327/58, 60, 62, 327/63, 64, 65, 71–79, 80, 81, 108, 111, 112, 379, 384, 387

[56] References Cited

U.S. PATENT DOCUMENTS

| 4,498,021 | 2/1985 | Uya . | |
|---|---|---|---|
| 4,910,455 | 3/1990 | Nadd | 327/73 |
| 5,175,451 | 12/1992 | Ihara | 327/63 |
| 5,187,686 | 2/1993 | Tran et al. . | |
| 5,317,254 | 5/1994 | Olson | 323/316 |
| 5,345,117 | 9/1994 | Tomotsune | 327/73 |
| 5,381,106 | 1/1995 | Limberg | 327/63 |

FOREIGN PATENT DOCUMENTS

| 0552941 | 7/1993 | European Pat. Off. . |
| 0632392 | 1/1995 | European Pat. Off. . |
| 61118023 | 6/1986 | Japan . |
| 2070120 | 3/1990 | Japan . |
| 6051882 | 2/1994 | Japan . |
| 8601658 | 3/1986 | WIPO . |

Primary Examiner—Timothy P. Callahan
Assistant Examiner—T. Lam
Attorney, Agent, or Firm—Rennie William Dover; Bradley J. Botsch, Sr.

[57] ABSTRACT

A circuit (10) for enhancing logic transitions appearing on a line (34) has been provided. The circuit includes a first comparator (14) for sensing when a voltage on the line exceeds a first level and subsequently pulling the voltage on the line to a first predetermined voltage. The circuit also includes a second comparator (12) for sensing when the voltage on the line falls below a second level and subsequently pulling the voltage on the line to a second predetermined voltage.

8 Claims, 3 Drawing Sheets

5,510,739

CIRCUIT AND METHOD FOR ENHANCING LOGIC TRANSITIONS APPEARING ON A LINE

BACKGROUND OF THE INVENTION

This invention relates, in general, to semiconductor circuits and, more particularly, to a circuit for enhancing the signal transitions on a bus.

Briefly, a bus is used in a complex digital integrated circuit (such as a microcontroller) to transmit data and control signals to many different portions of the integrated circuit. The speed at which the integrated circuit can operate is, therefore, dependent on the speed of signal transitions appearing on the bus. This dependency holds whether the bus is operating in full voltage or low voltage conditions. Moreover, as systems grow and more devices are coupled to the bus, there exists more capacitance appearing on the bus thereby having the effect of slowing down the charging and discharging of the bus.

Hence, it would be desirable as well as advantageous to provide a circuit and method for enhancing logic transitions appearing on a bus.

DETAILED DESCRIPTION OF THE DRAWINGS

Figure 1:
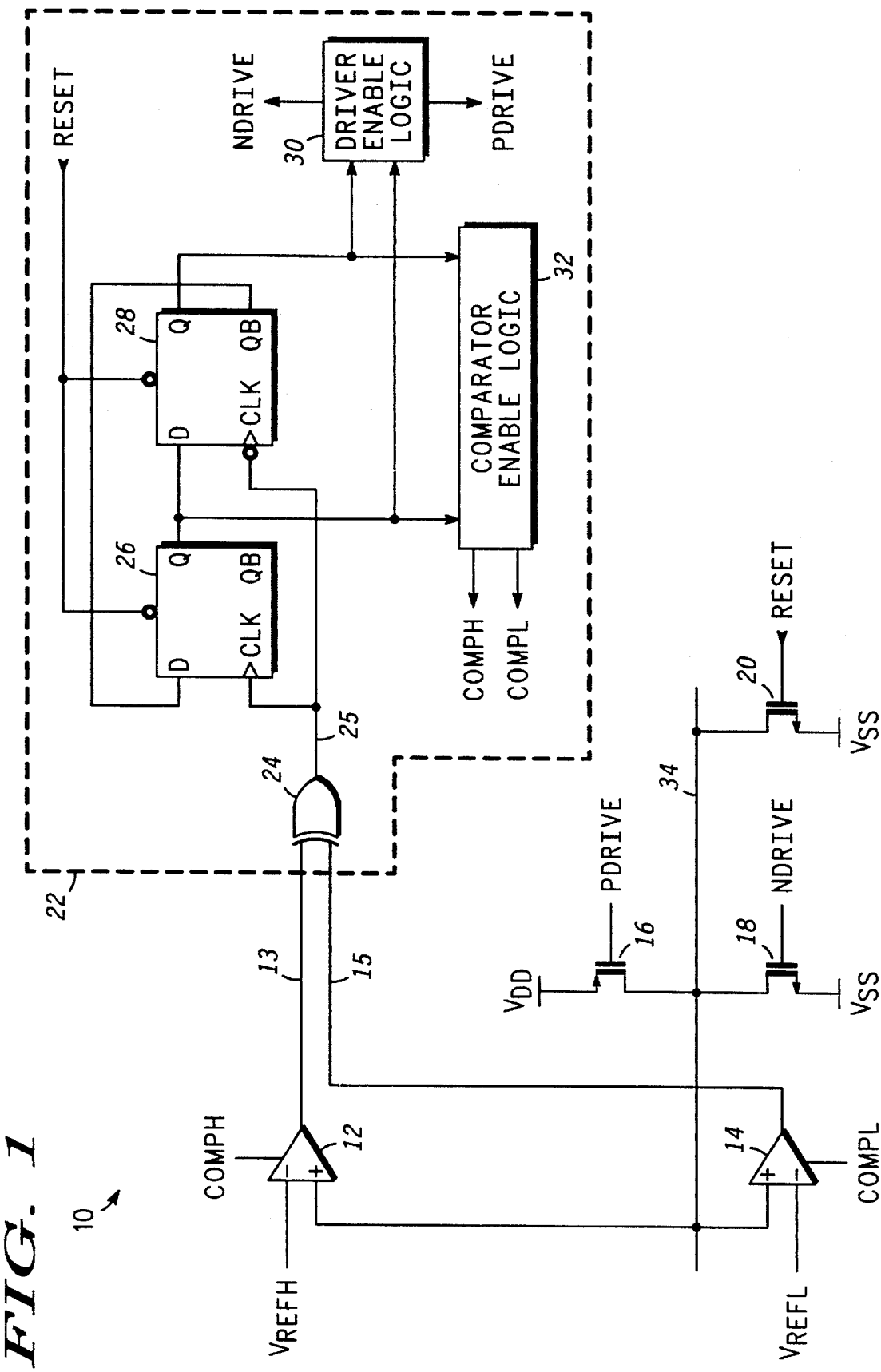
FIG. 1 is a detailed schematic/block diagram of a circuit for enhancing logic transitions appearing on a line in accordance with the present invention.

Referring to FIG. 1, a detailed schematic/block diagram of circuit 10 for enhancing logic transitions appearing on line 34 is shown wherein line 34 may be for example, a line of a bus. Circuit 10 includes comparator 14 having a non-inverting input coupled to bus 34 and an inverting input coupled to receive a first reference voltage $V_{REFL}$. Also, comparator 14 has an enable input which is coupled to receive signal COMPL from control circuit 22.

Comparator 12 has a non-inverting input coupled to bus 34 and an inverting input coupled to receive a second reference voltage $V_{REFH}$. Also, comparator 12 has an enable input coupled to receive signal COMPH from control circuit 22. The outputs of comparators 14 and 12 respectively provide signals 15 and 13 to control circuit 22.

Circuit 10 further includes n-channel transistor 18 having its drain electrode coupled to bus 34 and its source electrode coupled to a first supply voltage terminal at which the potential $V_{SS}$ is applied. The control electrode of transistor 18 is coupled to receive signal NDRIVE from control circuit 22.

Circuit 10 further includes p-channel transistor 16 which has a drain electrode coupled to bus 34 and a source electrode coupled to a second supply voltage terminal at which the potential $V_{DD}$ is applied. The control electrode of transistor 16 is coupled to receive signal PDRIVE from control circuit 22.

Circuit 10 additionally includes n-channel transistor 20 which has a drain electrode coupled to bus 34 and a source electrode coupled to the first supply voltage terminal. The control electrode of transistor 20 is coupled to receive a reset/initialization signal.

Control circuit 22 includes first and second inputs respectively coupled to the outputs of comparators 14 and 12 for providing signals COMPL and COMPH to comparators 14 and 12 and signals NDRIVE and PDRIVE to transistors 18 and 16, respectively. In particular, control circuit 22 includes exclusive OR gate 24 having first and second inputs respectively coupled to the outputs of comparators 14 and 12. The output of exclusive OR gate 24 provides signal 25 to a clock input of latch 26 and to an input inverting clock input of latch 28. A non-inverting output of latch 26 is coupled to a data input of latch 28 and to first inputs of comparator enable logic circuit 32 and driver enable logic circuit 30. A non-inverting output of latch 28 is coupled to second inputs of comparator enable logic circuit 32 and driver enable logic circuit 30. An inverting output of latch 28 is coupled to a data input of latch 26. The reset inputs of latches 26 and 28 are coupled to receive the reset signal.

Comparator enable logic block 32 provides signals COMPL and COMPH respectively to the enable inputs of comparators 14 and 12.

Driver enable logic circuit 30 provides signals N-DRIVE and P-DRIVE all respectively to the control electrodes of transistors 18 and 16.

Briefly, in operation, transistors 16 and 18 provide additional current for charging and discharging the capacitive bus 34, respectively. Comparators 12 and 14 provide voltage sensing capability for the control circuit 22. The components included within circuit 22 control transistors 16 and 18 wherein control circuit 22 provides positive feedback to the bus 34 via transistors 16 and 18 and the output of comparators 12 and 14. This feedback mechanism provides additional charging or discharging current to the bus 34 thereby decreasing the amount of time in which the bus takes to charge or discharge. Also, transistor 20 provides a means by which to initialize the bus voltage, via the reset/initialization signal RESET.

Figure 2:
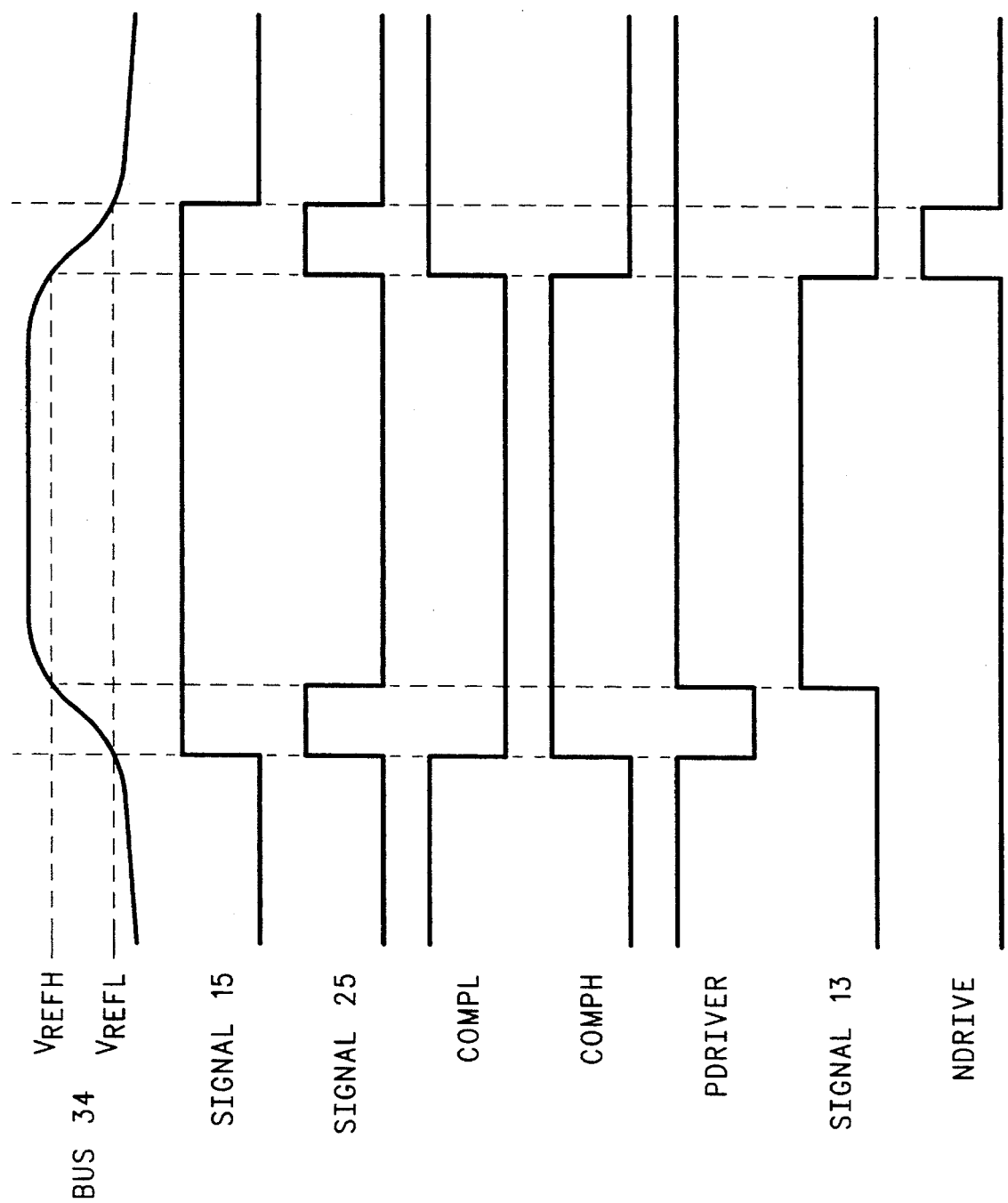
FIG. 2 is a graphical diagram illustrating various signals associated with the circuit of FIG. 1.

The functionality of the circuit in FIG. 1 can be better described by referring to FIG. 2 which is a graphical diagram illustrating various signals associated with the circuit of FIG. 1. The bus initially starts at a logic low state as shown in FIG. 2. The output of both comparators will also be a low logic state as shown by signals 15 and 25. A device (not shown and external to circuit 10) will begin to charge the bus 34 until the bus 34 potential reaches a potential of VREFL. At this point, comparator 14 will switch causing the output of comparator 14 to switch as illustrated by signal 15 transitioning to a logic high. The signal (signal 25) appearing at the output of the gate 24 will go to a logic high as shown in FIG. 2. It is understood that there is a small amount of delay between when the bus signal crosses voltage $V_{REFL}$ and the transition of signal 15 but that such delay (or any delay such as the delay between signals 15 and PDRIVE) is not shown in FIG. 2 for simplicity.

A logic high appearing on signal 25 will clock latch 26, causing its output to toggle to a logic high. This will cause signal COMPL to go to a logic low and signal COMPH to go to a logic high via comparator enable logic 32. As a result, comparator 14 will be disabled while comparator 12 will be enabled.

Furthermore, in response to the logic high appearing at the output of latch 26, driver enable block 30 will cause signal PDRIVE to go low as shown in FIG. 2 thereby enabling transistor 16 to provide charging current to the bus 34. However, when the bus 34 reaches a voltage potential equal to that of VREFH, the output of comparator 12, i.e., signal 13, will go to a logic high as shown in FIG. 2 causing signal 25 to go low via gate 24. This will clock latch 28, causing its non-inverting output to transition to a logic high. This will cause the PDRIVE signal to go to a logic high, via driver enable circuit 30 thereby turning off transistor 16. The bus 34 has now transitioned from a low logic level (VSS) to a high logic level (VDD) with the assistance of transistor 16 which is under control of the control circuit 22.

The transition of the bus 34 from a logic high to a logic low follows in a similar manner to that described above. The difference being, transistor 18 is enabled via signal NDRIVE instead of transistor 16 via signal PDRIVE. Comparator 12 is enabled at the beginning of the high to low transition of bus 34 but is disabled via signal COMPH when the bus voltage has fallen below VREFH. Comparator 14 will be enabled via signal COMPL and will remain on after the transition as shown in FIG. 2.

The signal RESET provides for initialization of the bus and also initialization of the latches, 26 and 28. This allows the system to begin in a known state.

The function of the comparator enable circuit 32 is to enable the comparators 12 and 14. This will reduce the power of circuit 10 since comparator enable logic 32 has the ability to selectively turn on and off the comparators 12 and 14. The comparator enable logic 32 has inputs taken from the output of the latches 26 and 28, and provides output signals COMPH and COMPL.

When the outputs of latches 26 and 28 are at a logic low, comparator enable circuit 32 will force signal COMPH to a logic low state and signal COMPL to a logic high state. The driver enable circuit, 30 should have outputs, PDRIVE and NDRIVE in a logic high state and a logic low state, respectively.

When the output of latch 26 is in a logic high state and the output of latch 28 is in a logic low state, the comparator enable logic 32 should place signal COMPH in a high logic state and signal COMPL in a low logic state. The driver enable circuit 30 should place signals PDRIVE and NDRIVE in a low logic state.

When the outputs of latch 26 and latch 28 are at a logic high, the comparator enable logic 32 should place signal COMPH in a logic high state and signal COMPL in a logic low state. The driver enable logic 30 should place signal PDRIVE in a logic high state and signal NDRIVE in a logic low state.

When the output of latch 26 is in a logic low state and the output of latch 28 is in a logic high state, the comparator enable logic 32 should place signal COMPL in a high logic state and signal COMPH in a low logic state. The driver enable circuit 30 should place signal PDRIVE and signal NDRIVE in a logic high state. Referring to Table 1, there is shown, in a summary form, the logic states of signals COMPL, COMPH, PDRIVE and NDRIVE with respect to the logic states appearing at the non-inverting outputs of latches 26 and 28 ($Q_{26}$ and $Q_{28}$).

| $Q_{26}$ | $Q_{28}$ | COMPL | COMPH | PDRIVE | NDRIVE |
|---|---|---|---|---|---|
| L | L | H | L | H | L |
| H | L | L | H | L | L |
| H | H | L | H | H | L |
| L | H | H | L | H | H |

Figure 3:
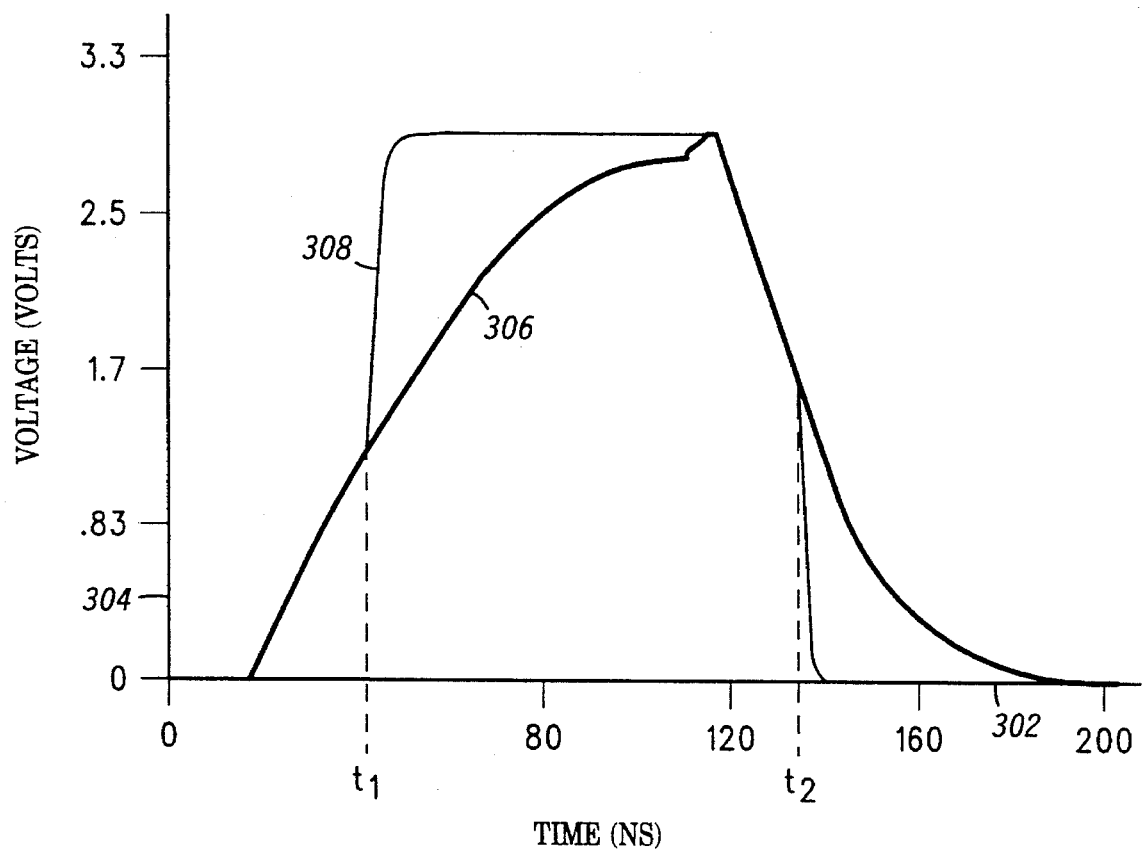
FIG. 3 is a graphical diagram illustrating logic transitions appearing on a bus with and without the circuit of FIG. 1.

Referring to FIG. 3, a graphical diagram illustrating a logic low to high transition and a logic high to low transition appearing on bus 34 with and without the use of circuit 10 is shown. In particular, FIG. 3 includes horizontal axis 302 which represents time in nanoseconds and vertical axis 304 which represents voltage in volts. Signal 306 in FIG. 3 represents a bus transition without the circuit 10 found in FIG. 1, given a specific load capacitive to the bus 34 and a specific driving device which is external to circuit 10. For the same bus load, driving device and technology, signal 308 represents a bus transition with the aid of circuit 10.

On the rising edge of a signal appearing on bus 34, both signals 306 and 308 follow each other until the voltage level on the bus exceeds the given VREFL level, at which point comparator 14 triggers causing transistor 16 to provide additional charging current and rapidly charging the voltage appearing on the bus as illustrated by signal 308. Likewise on the falling edge, both voltage signals follow each other until the voltage on the bus 34, reaches a second given voltage level, VREFH, at which time comparator 12 will trigger, causing transistor 18 to provide additional discharging current thereby rapidly discharging the voltage appearing on bus 34 as is also illustrated by signal 308. Thus, it is clear that with the addition of circuit 10, the logic transitions appearing on bus 34 are substantially speeded up thereby allowing bus 34 to operate at increased frequencies.

The present invention provides a method and circuit for enhancing logic transitions appearing on a bus. With such a method and circuit, the size of all devices that are required to charge and discharge a bus can be reduced thereby saving area. Moreover, the bus switching frequency can also be substantially increased with minimal increase in area.

While the invention has been described in specific embodiments thereof, it is evidence that many alterations, modifications and variations will be apparent to those skilled in the art. Further, it is intended to embrace all such alterations, modifications and variations in the appended claims.

We claim:

1. A circuit for enhancing logic transitions appearing on a line, comprising:

a first comparator having first and second inputs, an enable input, and an output, said first input of said first comparator coupled to the line, said second input of said first comparator coupled to receive a first reference voltage;

a second comparator having first and second inputs, an enable input, and an output, said first input of said second comparator coupled to the line, said second input of said second comparator coupled to receive a second reference voltage;

a first transistor having first and second current carrying electrodes and a control electrode, said first current carrying electrode of said first transistor coupled to the line, said second current carrying electrode of said first transistor coupled to a first supply voltage terminal;

a second transistor having first and second current carrying electrodes and a control electrode, said first current carrying electrode of said second transistor coupled to the line, said second current carrying electrode of said second transistor coupled to a second supply voltage terminal; and control means having inputs coupled to said outputs of said first and second comparators for alternately enabling said first and second comparators and for alternately enabling said first and second transistors, said control means having outputs coupled to said enable inputs of said first and second comparators and to said control electrodes of said first and second transistors.

2. The circuit according to claim 1 wherein said control means includes:

a first logic gate having first and second inputs and an output, said first input of said first logic gate coupled to said output of said first comparator, said second input of said first logic gate coupled to said output of said second comparator;

a first latch having a data input, a clock input and a non-inverting output, said clock input of said first latch coupled to said output of said first logic gate;

a second latch having a data input, a clock input, and non-inverting and inverting outputs, said data input of said second latch coupled to said non-inverting output of said first latch, said clock input of said second latch coupled to said output of said first logic gate, said inverting output of said second latch coupled to said data input of said first latch;

comparator enable logic circuitry having first and second inputs and first and second outputs, said first and second inputs of said comparator enable logic circuitry respectively coupled to said non-inverting outputs of said first and second latches, said first and second outputs of said comparator enable logic circuitry respectively coupled to said enable inputs of said first and second comparators; and driver enable logic circuitry having first and second inputs and first and second outputs, said first and second inputs of said driver enable logic circuitry respectively coupled to said non-inverting outputs of said first and second latches, said first and second outputs of said driver enable logic circuitry respectively coupled to said control electrodes of said first and second transistors.

3. The circuit according to claim 1 further including a third transistor having first and second current carrying electrodes and a control electrode, said first current carrying electrode of said third transistor coupled to the line, said second current carrying electrode of said third transistor coupled to said second supply voltage terminal, said control electrode of said third transistor coupled to receive a reset signal.

4. The circuit according to claim 3 wherein said first and second latches of said control means includes a reset input coupled to receive said reset signal.

5. A circuit for enhancing logic transitions appearing on a line, comprising:

first means, responsive to a first control signal, for sensing when a voltage appearing on the line exceeds a first level, said first means having an input coupled to the line and an output;

second means, responsive to a second control signal, for sensing when a voltage appearing on the line falls below a second level, said second means having an input coupled to the line and an output;

third means, responsive to a third control signal, for pulling said voltage appearing on the line to a first predetermined voltage;

fourth means, responsive to a fourth control signal, for pulling said voltage appearing on the line to a second predetermined voltage; and fifth means having inputs coupled to said outputs of said first and second means for alternately enabling said first and second means and for alternately enabling said third and fourth means, said fifth means having outputs for providing first, second, third and fourth control signals respectively to said first, second, third and fourth means.

6. The circuit according to claim 5 wherein said third means is enabled when said voltage appearing on the line exceeds said first level and wherein said fourth means is enabled when said voltage appearing on the line falls below said second level.

7. The circuit according to claim 5 wherein said fifth means includes:

a first logic gate having first, second inputs and an output, said first input of said first logic gate coupled to said output of said first means, said second input of said first logic gate coupled to said output of said second means;

a first latch having a data input, a clock input and a non-inverting output, said clock input of said first latch coupled to said output of said first logic gate;

a second latch having a clock input and non-inverting and inverting outputs, said clock input of said second latch coupled to said output of said first logic gate, said inverting output of said second latch coupled to said data input of said first latch;

comparator enable circuitry having first and second inputs and first and second outputs, said first and second inputs of said comparator enable logic circuitry respectively coupled to said non-inverting outputs of said first and second latches, said first and second outputs of said comparator enable logic circuitry for respectively providing said first and second control signals to said first and second means; and driver enable logic circuitry having first and second inputs and first and second outputs, said first and second inputs of said driver enable logic circuitry respectively coupled to said non-inverting outputs of said first and second latches, said first and second outputs of said driver enable logic circuitry for respectively providing third and fourth control signals to said third and fourth means.

8. The circuit according to claim 1, wherein the line is a bus line.

* * * * *